United States Patent
Chen et al.

(10) Patent No.: US 10,244,868 B2
(45) Date of Patent: Apr. 2, 2019

(54) SLIDE RAIL ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Hsiao-Han Lu, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 27 days.

(21) Appl. No.: 15/595,034

(22) Filed: May 15, 2017

(65) Prior Publication Data

US 2018/0070723 A1   Mar. 15, 2018

(30) Foreign Application Priority Data

Sep. 13, 2016   (TW) .............................. 105129909 A

(51) Int. Cl.

| F16C 29/04 | (2006.01) |
|---|---|
| A47B 88/49 | (2017.01) |
| A47B 88/40 | (2017.01) |
| A47B 88/57 | (2017.01) |
| B60N 2/07 | (2006.01) |
| A47B 88/493 | (2017.01) |
| A47B 88/423 | (2017.01) |
| H05K 7/14 | (2006.01) |

(52) U.S. Cl.
CPC ............ *A47B 88/49* (2017.01); *A47B 88/493* (2017.01); *F16C 29/04* (2013.01); *A47B 88/40* (2017.01); *A47B 88/423* (2017.01); *A47B 88/57* (2017.01); *A47B 2210/007* (2013.01); *A47B 2210/0032* (2013.01); *A47B 2210/0067* (2013.01); *B60N 2/07* (2013.01); *H05K 7/1489* (2013.01)

(58) Field of Classification Search
CPC ......... F16C 29/04; A47B 88/40; A47B 88/49; A47B 88/493; A47B 88/423; A47B 88/50; A47B 2210/007; A47B 2210/0067; A47B 2210/0032; B60N 2/07; H05K 7/1489
USPC .............. 384/20–22, 35, 49, 23; 312/334.38, 312/334.44, 333.46
See application file for complete search history.

(56) References Cited

U.S. PATENT DOCUMENTS

| 6,655,763 | B2 | 12/2003 | Judge et al. | |
|---|---|---|---|---|
| 6,854,816 | B2 | 2/2005 | Milligan | |
| 6,945,619 | B1 * | 9/2005 | Chen ................ | A47B 88/487 312/334.44 |
| 6,997,529 | B1 * | 2/2006 | Chen ................ | A47B 88/493 312/334.44 |

(Continued)

FOREIGN PATENT DOCUMENTS

| EP | 2238866 A1 * | 10/2010 | ........... A47B 88/493 |
|---|---|---|---|
| EP | 2929806 B1 * | 10/2017 | ............. A47B 88/43 |

(Continued)

*Primary Examiner* — Marcus Charles
(74) *Attorney, Agent, or Firm* — Rosenberg, Klein & Lee

(57) ABSTRACT

A slide rail assembly includes at least two slide rails, a slide-facilitating device, and a supporting structure. The slide-facilitating device enables the two slide rails to be displaced smoothly with respect to each other. The supporting structure serves to support a rail section of one of the two slide rails.

13 Claims, 16 Drawing Sheets

(56) References Cited

U.S. PATENT DOCUMENTS

| | | | | |
|---|---|---|---|---|
| 7,654,624 B2* | 2/2010 | Huang | A47B 88/49 | 312/333 |
| 7,658,457 B2* | 2/2010 | Lu | A47B 88/57 | 312/333 |
| 7,744,175 B2* | 6/2010 | Peng | A47B 88/57 | 312/333 |
| 7,896,452 B2* | 3/2011 | Chang | A47B 88/57 | 312/333 |
| 8,303,052 B2* | 11/2012 | Chen | A47B 88/493 | 312/319.1 |
| 8,317,278 B2* | 11/2012 | Enos | A47B 88/493 | 312/333 |
| 8,393,692 B2* | 3/2013 | Yu | H05K 7/1489 | 312/333 |
| 8,403,436 B2* | 3/2013 | Yu | H05K 7/1489 | 312/333 |
| 8,925,883 B2 | 1/2015 | Fan | | |
| 9,279,451 B2* | 3/2016 | Judge | F16C 29/04 | |
| 9,301,609 B2* | 4/2016 | Muller | A47B 88/493 | |
| 9,328,769 B1 | 5/2016 | Chen et al. | | |
| 2003/0141791 A1* | 7/2003 | Dubon | H05K 7/1421 | 312/333 |
| 2004/0174100 A1* | 9/2004 | Chen | A47B 88/487 | 312/333 |
| 2004/0227438 A1* | 11/2004 | Tseng | A47B 88/467 | 312/333 |
| 2005/0162052 A1* | 7/2005 | Chen | A47B 88/487 | 312/334.5 |
| 2006/0029304 A1* | 2/2006 | Chen | A47B 88/493 | 384/18 |
| 2008/0124009 A1* | 5/2008 | Peng | A47B 88/40 | 384/21 |
| 2008/0129170 A1* | 6/2008 | Peng | A47B 88/493 | 312/334.44 |
| 2009/0096340 A1* | 4/2009 | Chen | A47B 88/493 | 312/334.46 |
| 2013/0016928 A1* | 1/2013 | Chen | A47B 88/493 | 384/35 |
| 2013/0259411 A1* | 10/2013 | Judge | F16C 29/04 | 384/49 |

FOREIGN PATENT DOCUMENTS

| | | | | |
|---|---|---|---|---|
| GB | 2401534 A * | 11/2004 | | A47B 88/487 |
| GB | 2401535 A * | 11/2004 | | A47B 88/467 |

* cited by examiner

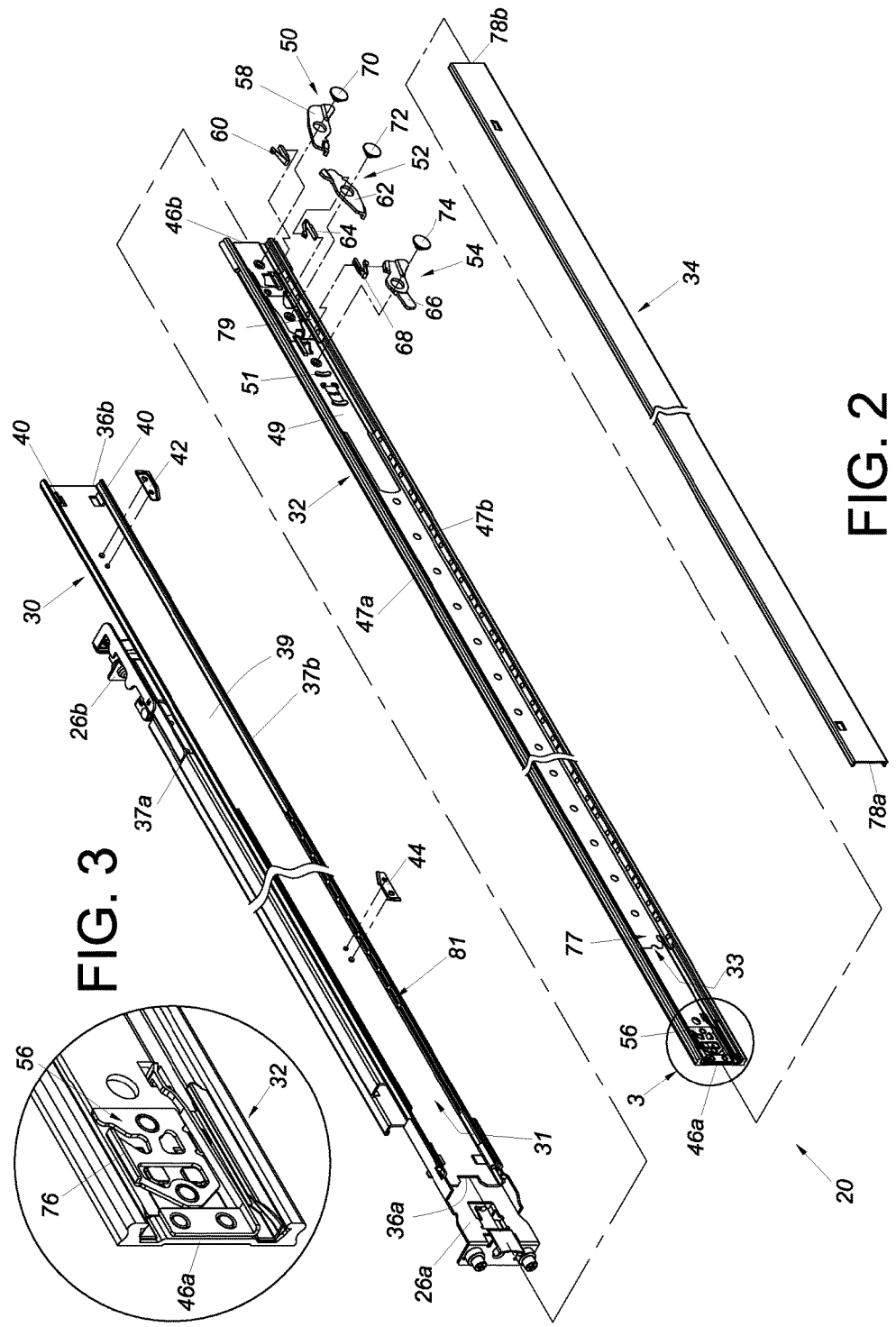

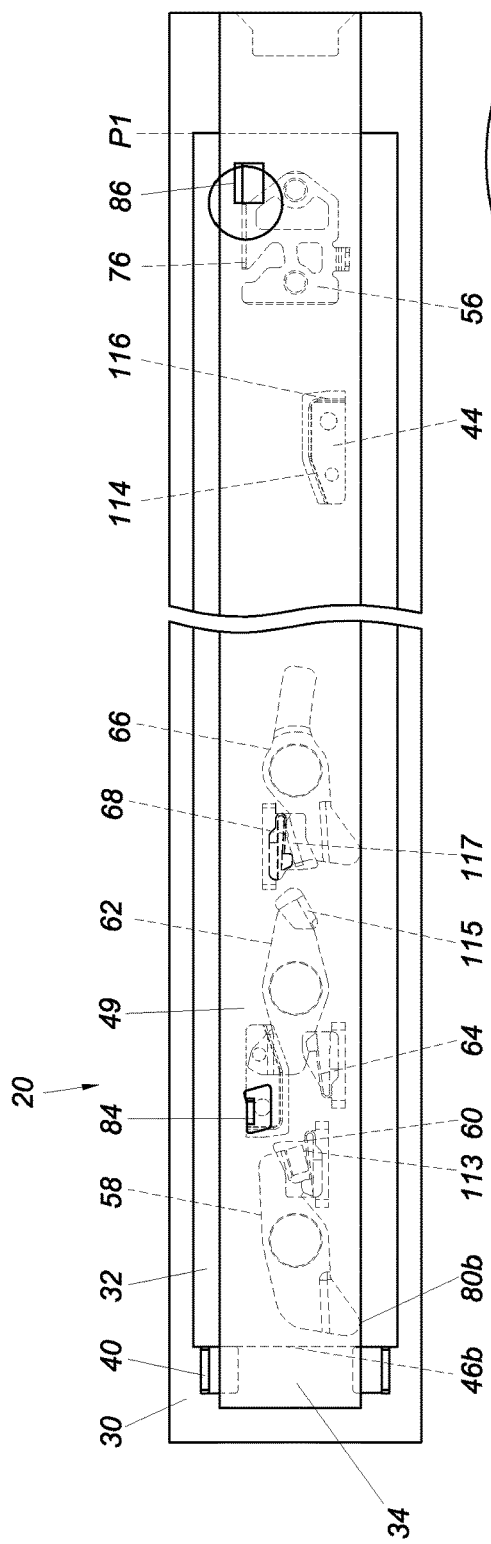
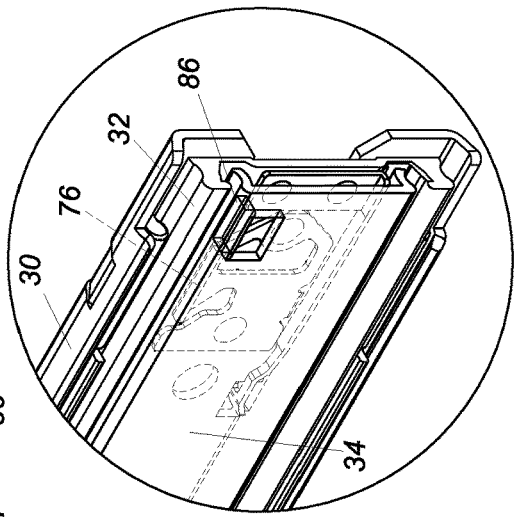
FIG. 6
FIG. 7

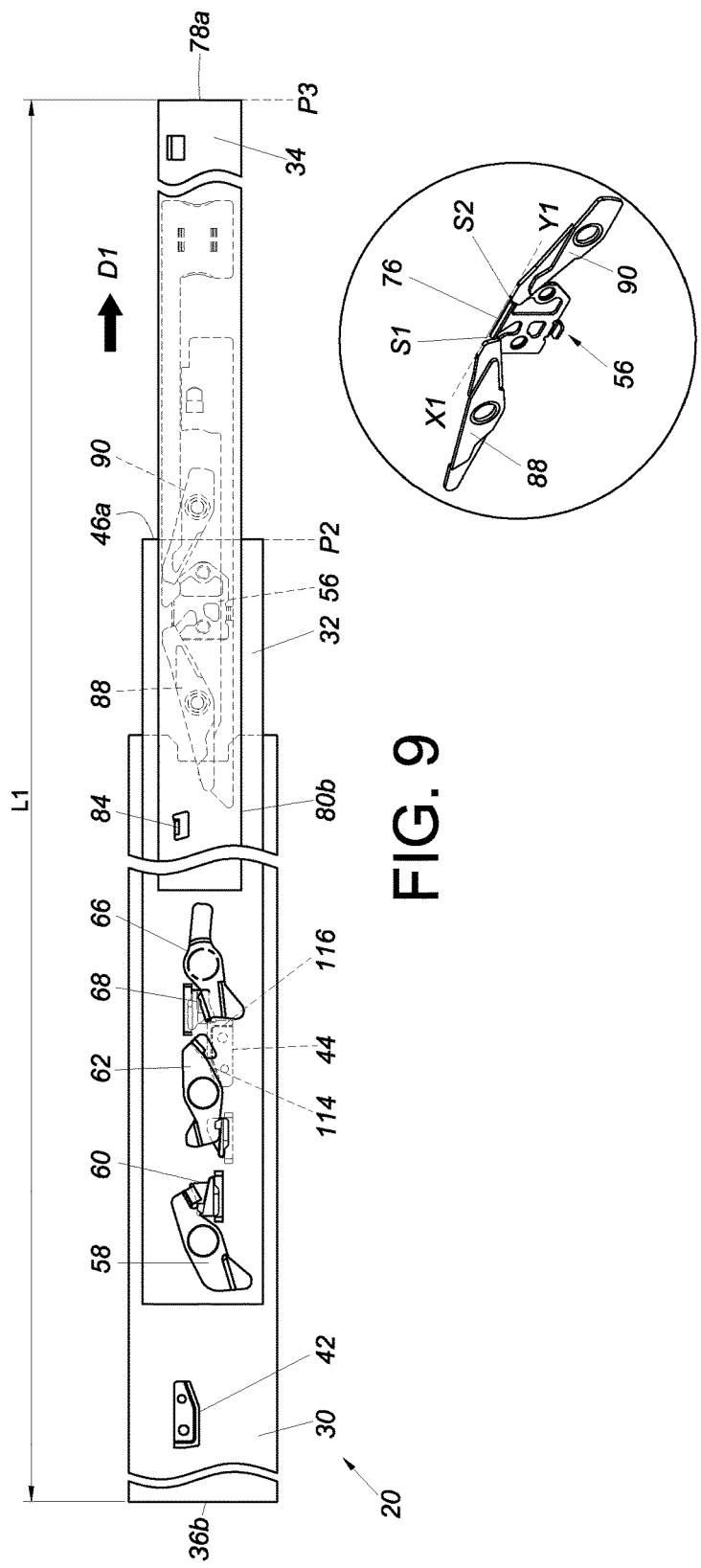

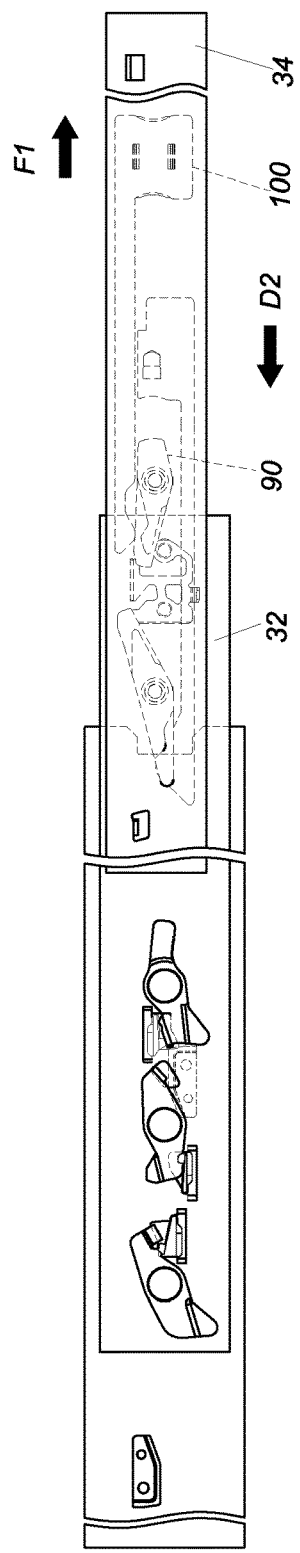
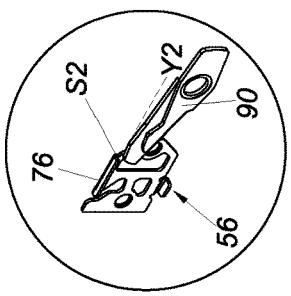
FIG. 11
FIG. 12

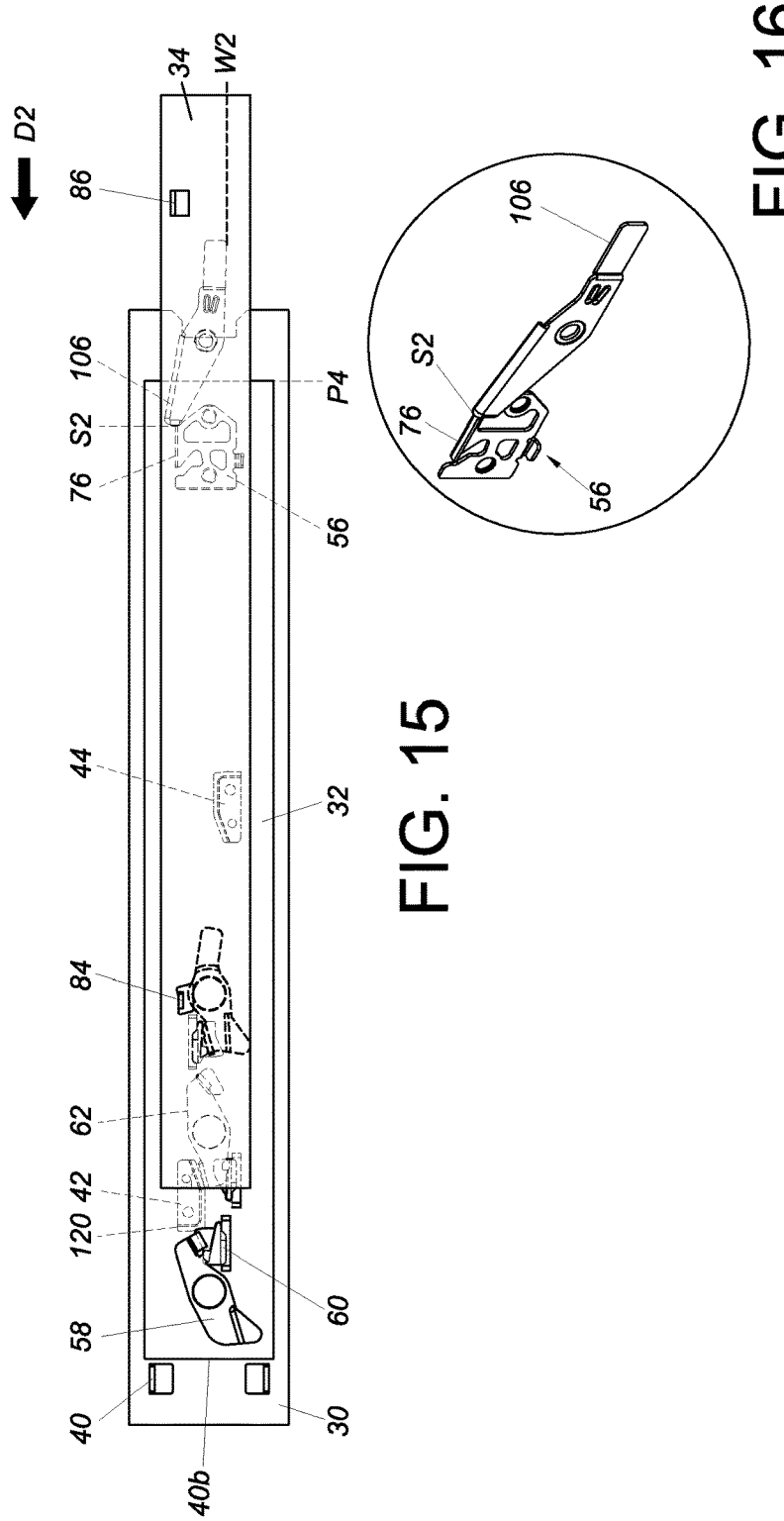

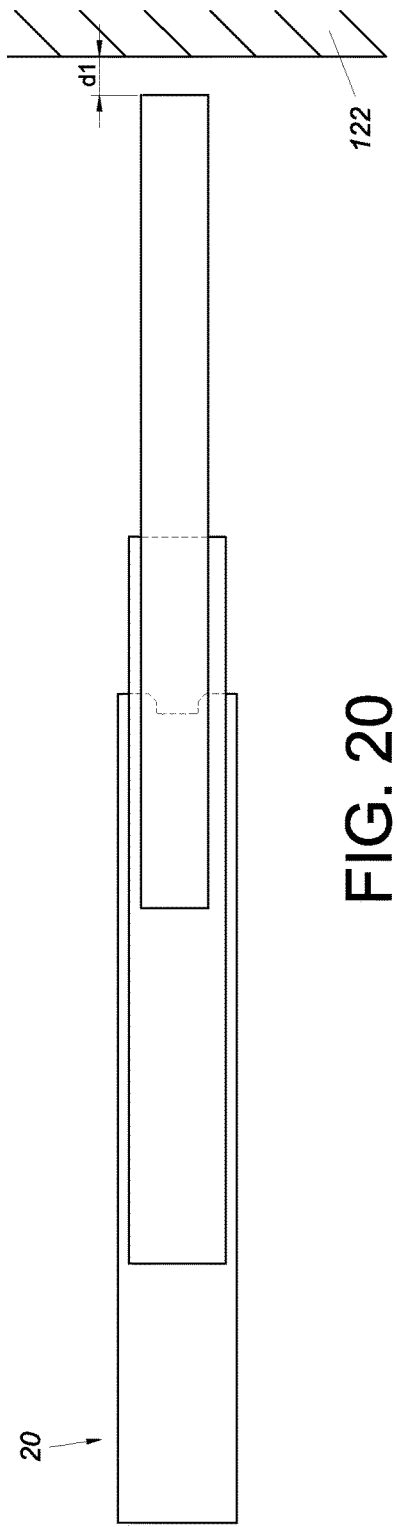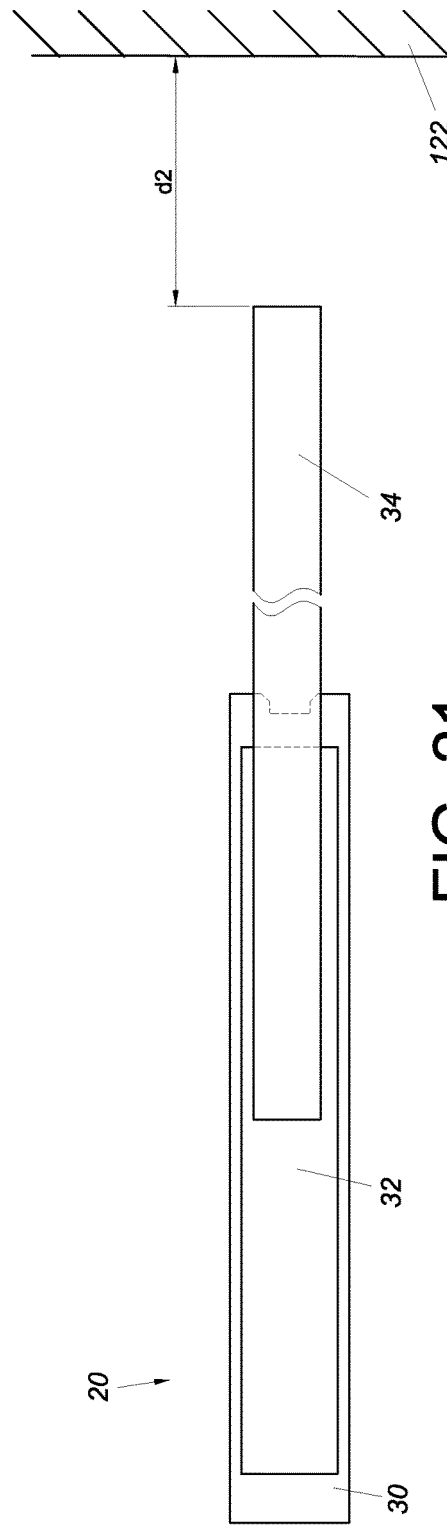

SLIDE RAIL ASSEMBLY

FIELD OF THE INVENTION

The present invention relates to a slide rail assembly and more particularly to one with a plurality of supporting mechanisms between two slide rails.

BACKGROUND OF THE INVENTION

Generally, a slide rail assembly includes at least two rails that can be displaced with respect to each other to bring the slide rail assembly into an extended or retracted state. The at least two rails are typically supported with respect to each other via a supporting mechanism (e.g., a slide-facilitating device) provided therebetween, wherein the slide-facilitating device has rolling balls or rollers configured to facilitate relative displacement of the at least two rails.

However, a single supporting mechanism sometimes cannot satisfy the need of support between two slide rails. It is therefore an important issue in the slide rail industry to develop a novel slide rail product that has multiple supporting mechanisms.

SUMMARY OF THE INVENTION

The present invention relates to a slide rail assembly with a plurality of supporting mechanisms between two slide rails.

According to one aspect of the present invention, a slide rail assembly includes at least two slide rails, a slide-facilitating device, and a supporting structure. The at least two slide rails are movably connected to each other. One of the at least two slide rails includes a front end, a rear end, and a separating member located between the front end and the rear end. The slide-facilitating device is mounted between the separating member and the front end of said slide rail so as to provide support for the other one of the at least two slide rails. The supporting structure is located between the separating member and the rear end of said slide rail.

Preferably, the slide rail assembly includes a first rail, a second rail, and a third rail, in which the second rail and the third rail are movably connected to each other, and the second rail includes the front end, the rear end, and the separating member located between the front end and the rear end. The slide-facilitating device is movably mounted between the separating member and the front end of the second rail so as to provide support for the third rail. The supporting structure is located between the separating member of the second rail and the rear end of the second rail and is configured for supporting the third rail when the third rail is retracted with respect to the second rail. Moreover, the second rail can be displaced with respect to the first rail, and the third rail can be displaced with respect to the second rail.

Preferably, the third rail includes an upper wall, a lower wall, and a longitudinal wall connected between the upper wall and the lower wall; the supporting structure includes an upper portion and a lower portion; and at least one rolling member is arranged on each of the upper portion and the lower portion in order to support a corresponding one of the upper wall and the lower wall of the third rail. Alternatively, the supporting structure includes an upper portion and a lower portion for supporting the upper wall and the lower wall of the third rail respectively Preferably, the slide rail assembly further includes a first engaging mechanism movably mounted on the second rail. When the second rail is displaced with respect to the first rail from a first position to a second position in a first direction and the third rail is displaced with respect to the second rail to a third position in the first direction and thus moved beyond the second rail, a rear end of the first rail and a front end of the third rail define a first length therebetween. When the second rail is displaced from the second position to a fourth position in a second direction, the first length between the rear end of the first rail and the front end of the third rail is reduced to a second length, and the second rail is at the fourth position with respect to the first rail thanks to the first engaging mechanism.

Preferably, the slide rail assembly further includes a first working member and a blocking base. The first working member is mounted on the third rail and can be displaced between a first working position and a second working position by operation. The blocking base is arranged on the second rail and includes a blocking portion. When the third rail is displaced to a predetermined position in the first direction, the first working member is at the first working position and pressed against a lateral side of the blocking portion of the blocking base. Once displaced from the first working position to the second working position by operation, the first working member is no longer pressed against the blocking portion of the blocking base; as a result, the third rail can be detached from the second rail.

Preferably, the slide rail assembly further includes a second working member elastically mounted on the third rail. While the third rail is being displaced to the predetermined position in the first direction, the second working member is displaced along the blocking portion of the blocking base. Once moved past the blocking portion of the blocking base, the second working member is pressed against another lateral side of the blocking portion of the blocking base.

Preferably, the slide rail assembly further includes a switching member mounted on the third rail. The switching member can be displaced between a first switching position and a second switching position by operation, wherein the switching member is offset from the blocking portion of the blocking base when at the first switching position and is not offset from the blocking portion of the blocking base when at the second switching position.

Preferably, the third rail includes a front stopper spaced from the switching member.

Preferably, the slide rail assembly further includes a first blocking member arranged on the first rail, and the second rail is pressed against the first blocking member via the first engaging mechanism when at the fourth position.

Preferably, the first engaging mechanism includes a first engaging member and a first elastic member for applying an elastic force to the first engaging member. The first engaging member is pressed against the first blocking member by the elastic force of the first elastic member when the second rail is at the fourth position.

Preferably, the slide rail assembly further includes a second blocking member and a second engaging mechanism, and the third rail includes a rear stopper. The second blocking member is arranged on the first rail and includes a disengaging portion. The second engaging mechanism is movably mounted on the second rail. The third rail can be pressed against the second engaging mechanism via the rear stopper and thus simultaneously displace the second rail from the first position in the first direction until the second engaging mechanism is disengaged from the rear stopper by the disengaging portion of the second blocking member.

Preferably, the second engaging mechanism includes a second engaging member and a second elastic member for applying an elastic force to the second engaging member, and the third rail can be pressed against the second engaging member via the rear stopper.

Preferably, the second blocking member further includes a position-limiting portion, and the slide rail assembly further includes a third engaging mechanism movably mounted on the second rail. When the second rail is displaced to the second position, the third engaging mechanism is adjacent to the position-limiting portion of the second blocking member. The first engaging mechanism, the second engaging mechanism, and the third engaging mechanism are located between the separating member of the second rail and the rear end of the second rail.

Preferably, the third engaging mechanism includes a third engaging member and a third elastic member for applying an elastic force to the third engaging member. When the second rail is displaced to the second position, the third engaging member is adjacent to the position-limiting portion of the second blocking member in response to the elastic force of the third elastic member.

Preferably, the slide rail assembly is adapted for mounting an object to a rack, wherein the first rail is mountable to the rack, and the third rail is configured for supporting the object.

BRIEF DESCRIPTION OF THE DRAWINGS

FIG. 2 is an exploded perspective view of the slide rail assembly according to an embodiment of the present invention;

FIG. 3 is an enlarged view of the circled area 3 in FIG. 2, showing in particular that the blocking base of the second rail includes a blocking portion;

FIG. 6 shows the slide rail assembly according to an embodiment of the present invention in a retracted state, in which a first engaging mechanism, a second engaging mechanism, and a third engaging mechanism are each in a predetermined state;

FIG. 7 is a partial perspective view showing that the front stopper of the third rail in FIG. 6 is pressed against the blocking base of the second rail;

FIG. 9 shows that the third rail in FIG. 8 is further displaced with respect to the second rail in the first direction such that not only is the second engaging member of the second engaging mechanism rotated by an angle under the guidance of the disengaging portion of the second blocking member, but also the third engaging member of the third engaging mechanism ends up adjacent to the position-limiting portion of the second blocking member;

FIG. 10 is a partial perspective view showing that the first working member and the second working member in FIG. 9 are pressed respectively against two lateral sides of the blocking portion of the blocking base of the second rail;

FIG. 11 shows that the second working member in FIG. 10 is operated and therefore no longer pressed against the blocking portion of the blocking base of the second rail;

FIG. 12 is a partial perspective view showing that the second working member in FIG. 11 is not pressed against the blocking portion of the blocking base of the second rail;

FIG. 15 shows that, by displacing the third rail in FIG. 14 in a second direction, the second rail is driven to a retracted position by the switching member;

FIG. 16 is a partial perspective view showing that the switching member in FIG. 15 is pressed against the blocking portion of the blocking base of the second rail;

FIG. 20 shows a first space between the slide rail assembly according to an embodiment of the present invention and an ambient article when the slide rail assembly is in a first extended state;

FIG. 21 shows a second space between the slide rail assembly in FIG. 20 and the ambient article when the slide rail assembly is in a second extended state;

DETAILED DESCRIPTION OF THE INVENTION

Figure 1:
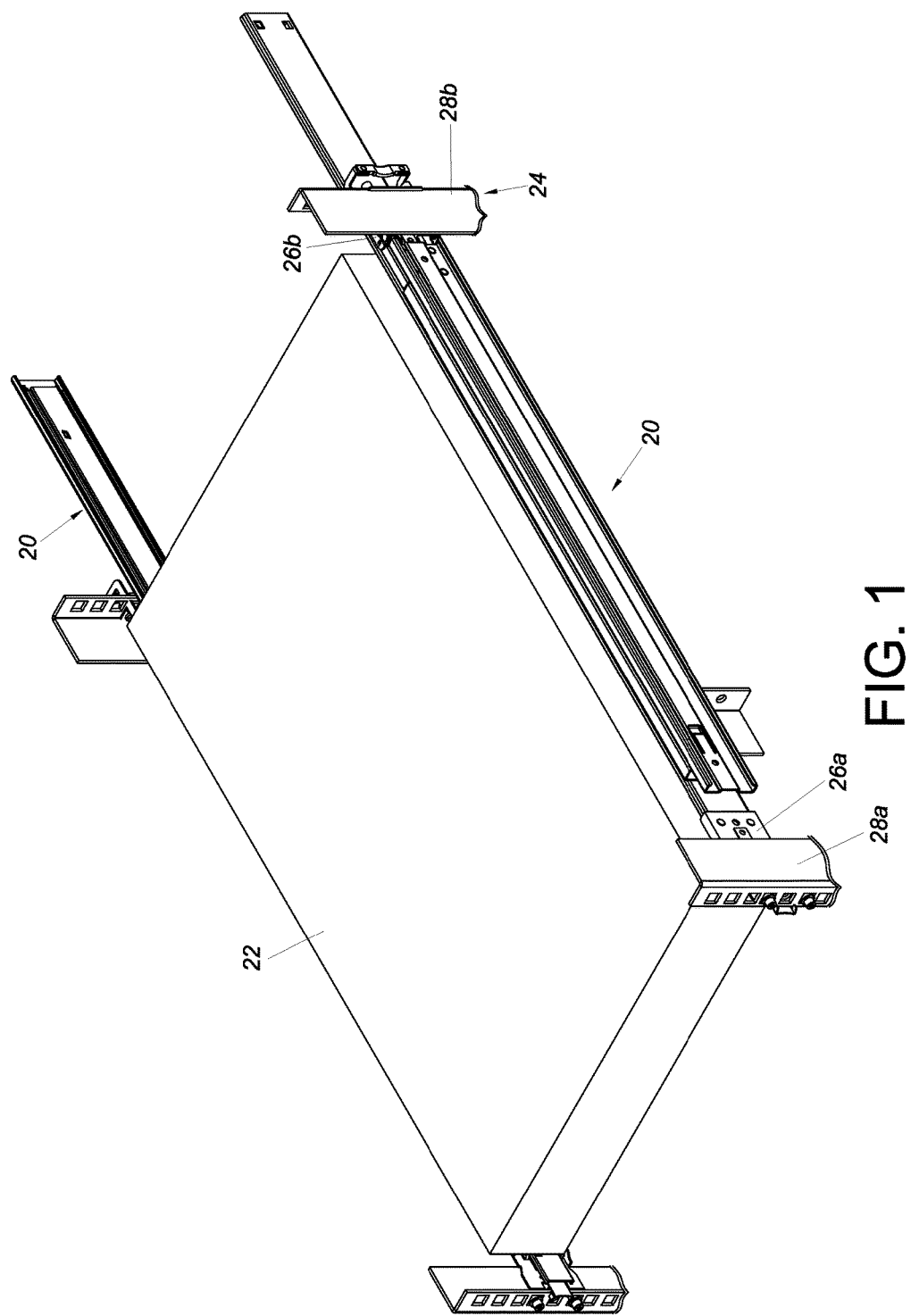
FIG. 1 is a perspective view showing how a pair of slide rail assemblies according to an embodiment of the present invention mount an object to a rack.

Referring to FIG. 1, a pair of slide rail assemblies 20 according to an embodiment of the present invention are used to mount an object 22 to a rack 24. More specifically, each slide rail assembly 20 is mounted to a first post 28a and a second post 28b of the rack 24 via a first bracket 26a and a second bracket 26b respectively. As the mechanism of mounting a slide rail assembly to a rack is well known in the art, further description is omitted herein for the sake of brevity.

As shown in FIG. 2, the slide rail assembly 20 includes a first rail 30, a second rail 32, and a third rail 34. The first rail 30, on which the corresponding first bracket 26a and second bracket 26b are arranged, has a front end 36a and a rear end 36b. More specifically, the first rail 30 includes an upper wall 37a, a lower wall 37b, and a longitudinal wall 39 connected between the upper wall 37a and the lower wall 37b. The upper wall 37a, the lower wall 37b, and the longitudinal wall 39 of the first rail 30 jointly define a first channel 31. Preferably, the first rail 30 has at least one contact portion 40, e.g., two projections, adjacent to the rear end 36b. In this embodiment, the slide rail assembly 20 further includes a first blocking member 42 and a second blocking member 44. The first blocking member 42 is arranged adjacent to the rear end 36b of the first rail 30 while the second blocking member 44 is arranged away from the rear end 36b of the first rail 30.

The second rail 32 can be displaced with respect to the first channel 31 of the first rail 30. For example, the second rail 32 can partially extend out of the first channel 31 (i.e., extend with respect to the first rail 30) and be retracted into the first channel 31 (i.e., be retracted with respect to the first rail 30). The second rail 32 has a front end 46a and a rear end 46b. More specifically, the second rail 32 includes an upper wall 47a, a lower wall 47b, and a longitudinal wall 49 connected between the upper wall 47a and the lower wall 47b. The upper wall 47a, the lower wall 47b, and the longitudinal wall 49 of the second rail 32 jointly define a second channel 33. The second rail 32 also includes a separating member 51 located between the front end 46a and the rear end 46b of the second rail 32. In this embodiment, the separating member 51 is arranged on and protrudes from the longitudinal wall 49 of the second rail 32 by way of example. Preferably, the slide rail assembly 20 further includes a first engaging mechanism 50, a second engaging mechanism 52, a third engaging mechanism 54, and a blocking base 56. The first engaging mechanism 50, the second engaging mechanism 52, and the third engaging mechanism 54 are all mounted on the second rail 32 but are at different positions. For example, the second engaging mechanism 52 is located between the first engaging mechanism 50 and the third engaging mechanism 54, wherein the first engaging mechanism 50 is adjacent to the rear end 46b of the second rail 32. The first engaging mechanism 50 includes a first engaging member 58 and a first elastic member 60 for applying an elastic force to the first engaging member 58. The second engaging mechanism 52 includes a second engaging member 62 and a second elastic member 64 for applying an elastic force to the second engaging member 62. The third engaging mechanism 54 includes a third engaging member 66 and a third elastic member 68 for applying an elastic force to the third engaging member 66. Preferably, a first pivotal connection member 70, a second pivotal connection member 72, and a third pivotal connection member 74 are also provided to pivotally connect the first engaging member 58, the second engaging member 62, and the third engaging member 66 to the second rail 32 respectively. The blocking base 56 (as can be seen more clearly in FIG. 3) is arranged on the second rail 32, e.g., at a position adjacent to the front end 46a of the second rail 32. The blocking base 56 has a blocking portion 76.

Preferably, the slide rail assembly 20 further includes a first slide-facilitating device 77, a supporting structure 79, and a second slide-facilitating device 81. The first slide-facilitating device 77 (which is also referred to herein as the slide-facilitating device) is movably mounted between the separating member 51 of the second rail 32 and the blocking base 56 at the front end 46a of the second rail 32. Moreover, the first slide-facilitating device 77 is in the second channel 33 of the second rail 32. The supporting structure 79 is located between the separating member 51 of the second rail 32 and the rear end 46b of the second rail 32 and is also in the second channel 33 of the second rail 32. The second slide-facilitating device 81, on the other hand, is in the first channel 31 of the first rail 30.

The third rail 34 is mounted in the second channel 33 of the second rail 32 and is configured to support the object 22 (not shown in FIG. 2). As the mechanism by which the third rail 34 supports the object 22 is well known in the art, further description is omitted herein for the sake of brevity.

Figure 4:
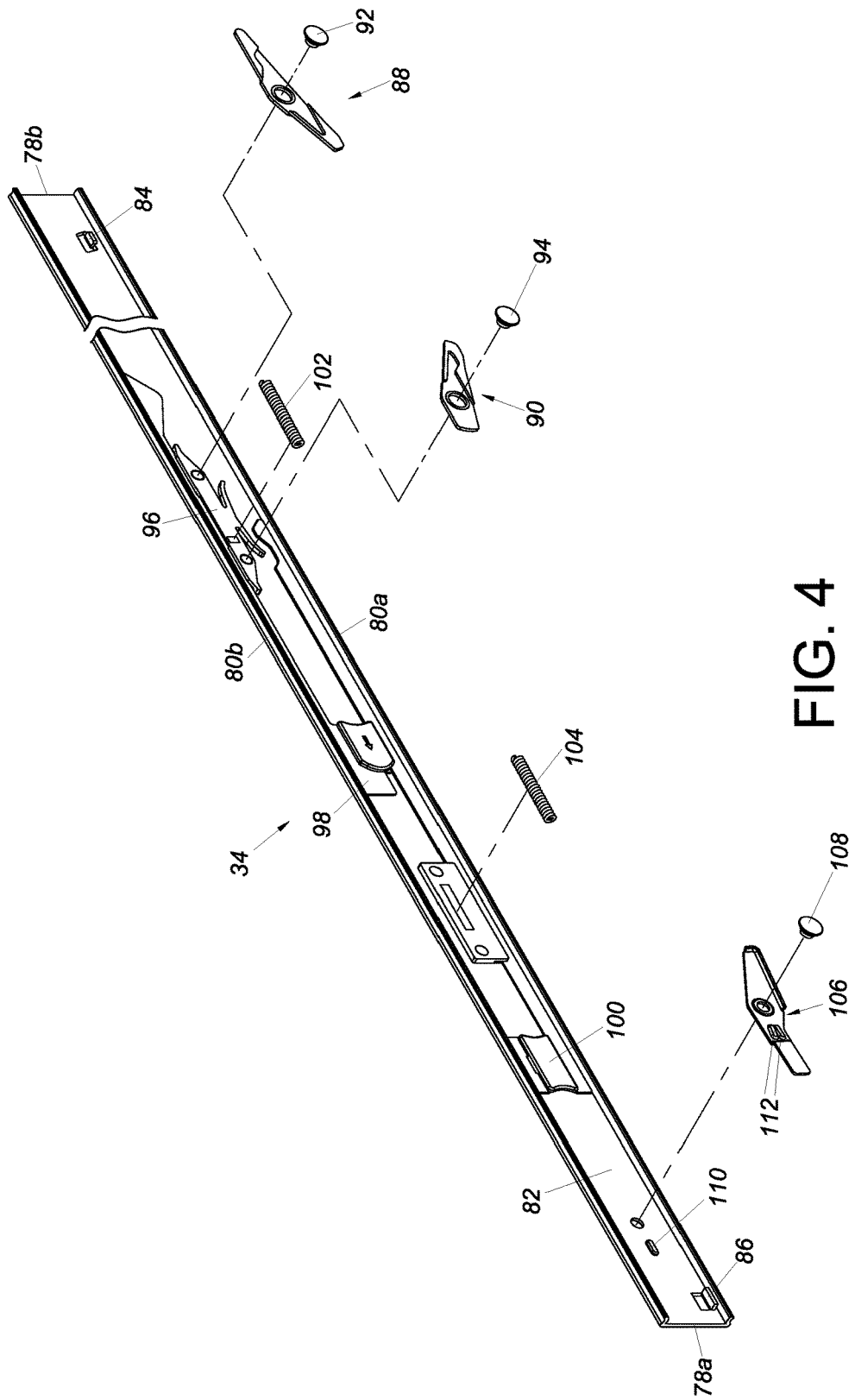
FIG. 4 is an exploded perspective view showing the third rail of the slide rail assembly according to an embodiment of the present invention, along with a first working member, a second working member, a switching member, and an auxiliary elastic member.
Figure 5:
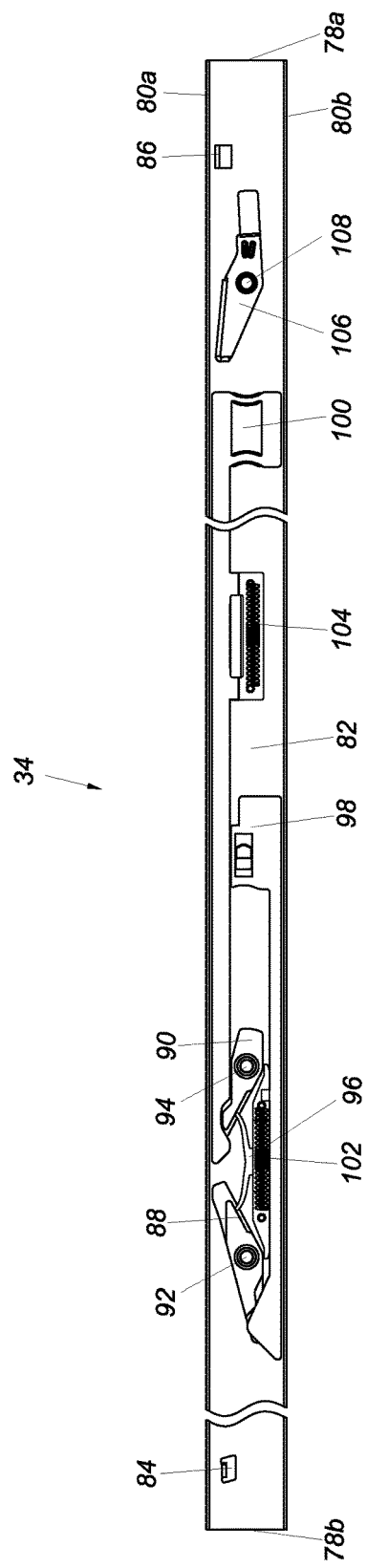
FIG. 5 is an assembled side view of the third rail of the slide rail assembly according to an embodiment of the present invention.

Referring to FIG. 4 and FIG. 5, the third rail 34 has a front end 78a and a rear end 78b. In addition, the third rail 34 includes an upper wall 80a, a lower wall 80b, and a longitudinal wall 82 connected between the upper wall 80a and the lower wall 80b. Please note that the third rail 34 is shown upside down in FIG. 4 (as compared with the third rail 34 in FIG. 5), and that therefore the upper wall 80a, the lower wall 80b, and all the other components in FIG. 4 are also upside down. The third rail 34 includes a rear stopper 84 and a front stopper 86. The rear stopper 84 is adjacent to the rear end 78b of the third rail 34 while the front stopper 86 is adjacent to the front end 78a of the third rail 34. In this embodiment, both the rear stopper 84 and the front stopper 86 are projections by way of example.

Preferably, a first working member 88 and a second working member 90 are mounted on the longitudinal wall 82 of the third rail 34, and in this embodiment, a fourth pivotal connection member 92 and a fifth pivotal connection member 94 are also provided to pivotally connect the first working member 88 and the second working member 90 to the longitudinal wall 82 of the third rail 34 respectively.

This embodiment further includes an elastic base 96, a first operating member 98, a second operating member 100, a first auxiliary elastic member 102, and a second auxiliary elastic member 104. The elastic base 96 is connected to the longitudinal wall 82 of the third rail 34 and is configured to provide elastic support for at least a portion of the first working member 88 and at least a portion of the second working member 90. The first operating member 98 and the second operating member 100 are configured to operate the first working member 88 and the second working member 90 respectively. The first auxiliary elastic member 102 and the second auxiliary elastic member 104 are configured to apply an elastic force to the first operating member 98 and the second operating member 100 respectively. Moreover, it is preferable that a switching member 106 is mounted on the third rail 34, and that the switching member 106 is spaced from the front stopper 86 by a longitudinal distance. More specifically, the switching member 106 is movably connected (e.g., pivotally connected via a sixth pivotal connection member 108) to the longitudinal wall 82 of the third rail 34. Preferably, the third rail 34 further includes a supporting feature 110, and the switching member 106 includes two switching features 112. The supporting feature 110 can support either one of the switching features 112, depending on the position of the switching member 106. The supporting feature 110 and the two switching features 112 are corresponding structures such as a recess and two projections, or a projection and two recesses, or a projection and two other projections.

Referring to FIG. 6, the first engaging member 58, the second engaging member 62, and the third engaging member 66 have a first extension portion 113, a second extension portion 115, and a third extension portion 117 respectively. These extension portions extend through the longitudinal wall 49 of the second rail 32 to correspond to the first rail 30. The second blocking member 44 includes a disengaging portion 114 and a position-limiting portion 116 extending from and bent with respect to the disengaging portion 114. The disengaging portion 114 may be an inclined or curved surface. When the slide rail assembly 20 is in a retracted state, the second rail 32 is retracted with respect to the first rail 30 and is at a first position P1, where the rear end 46b of the second rail 32 is pressed against the at least one contact portion 40 of the first rail 30. On the other hand, the third rail 34 is also retracted with respect to the second rail 32 such that the front stopper 86 of the third rail 34 is pressed against the blocking portion 76 of the blocking base 56 of the second rail 32 (see FIG. 7). In this state, two opposite portions of the first engaging member 58 are respectively supported by the first elastic member 60 and the third rail 34 (e.g., the lower wall 80b of the third rail 34) to keep the first engaging member 58 in a predetermined state, and each of the second engaging member 62 and the third engaging member 66 is also kept in a predetermined state by the elastic force of the corresponding second elastic member 64 or third elastic member 68. While in the predetermined state, the second engaging member 62 corresponds in position to the rear stopper 84 of the third rail 34. In this embodiment, the rear stopper 84 is spaced from the second engaging member 62, and there is a first distance between the second extension portion 115 of the second engaging member 62 and the disengaging portion 114 of the second blocking member 44 of the first rail 30. Besides, while the third engaging member 66 is in the predetermined state, there is a second distance between the third extension portion 117 of the third engaging member 66 and the disengaging portion 114 of the second blocking member 44 of the first rail 30.

Figure 8:
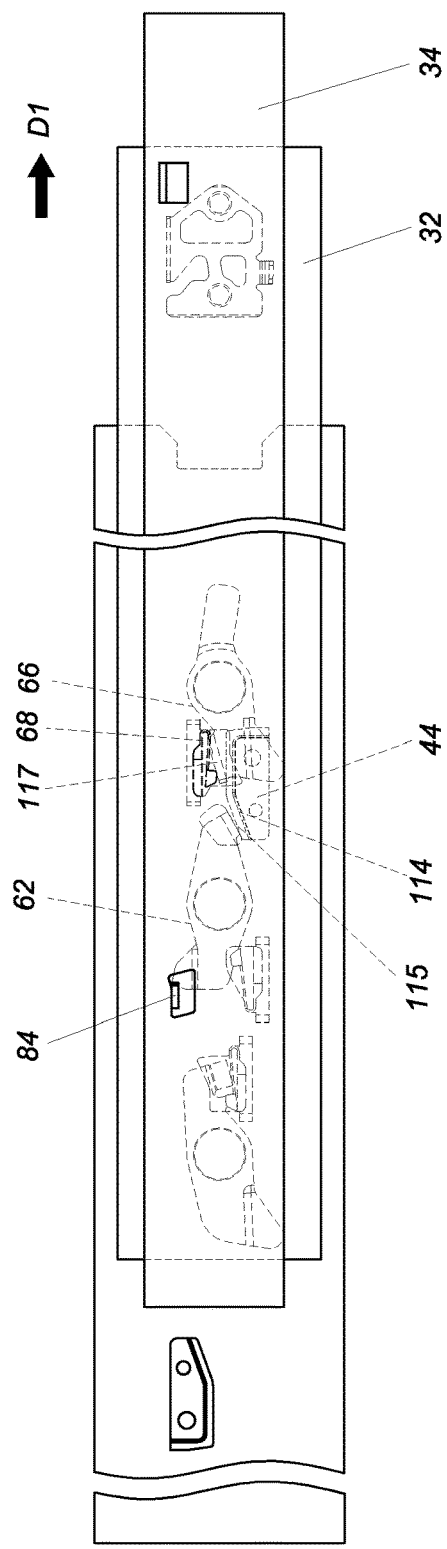
FIG. 8 shows how the third rail of the slide rail assembly according to an embodiment of the present invention displaces the second rail in a first direction via the rear stopper pressed against the second engaging member of the second engaging mechanism.

Referring to FIG. 8, when the third rail 34 is displaced with respect to the second rail 32 in a first direction D1, the second rail 32 is simultaneously driven by the third rail 34 into displacement in the first direction D1 from the first position P1 due to the fact that the rear stopper 84 is pressed against the second engaging member 62. Once the second rail 32 is displaced to a certain position, the third extension portion 117 of the third engaging member 66 is pressed against the second blocking member 44 under the guidance of the disengaging portion 114 of the second blocking member 44. As a result, the third elastic member 68 stores an elastic force, and the second extension portion 115 of the second engaging member 62 is in contact with the disengaging portion 114 of the second blocking member 44.

Referring to FIG. 9, when the third rail 34 is further displaced in the first direction D1 to a predetermined position, the second engaging member 62 is rotated by a certain angle under the guidance of the disengaging portion 114 of the second blocking member 44 and is consequently disengaged from the rear stopper 84 of the third rail 34, thereby terminating simultaneous displacement of the second rail 32 and the third rail 34, and the second rail 32 ends up at a second position P2 with respect to the first rail 30. In addition, once moved past the second blocking member 44, the third engaging member 66 is rotated by an angle in response to the elastic force of the third elastic member 68 and becomes adjacent to the position-limiting portion 116 of the second blocking member 44, thus allowing the second rail 32 to stay temporarily at the second position P2. When the third rail 34 is further displaced with respect to the second rail 32 in the first direction D1, the first engaging member 58 will no longer be supported by the third rail 34 (e.g., by the lower wall 80b of the third rail 34) but will be rotated by an angle in response to the elastic force of the first elastic member 60 such that the first engaging member 58 corresponds to the first blocking member 42 of the first rail 30.

More specifically, when the third rail 34 reaches a third position P3 (e.g., an extended position) after being displaced with respect to the second rail 32 in the first direction D1, with the front end 78a of the third rail 34 protruding beyond the front end 46a of the second rail 32, the first, second, and third rails 30, 32, 34 jointly define a first length L1; in other words, the distance between the rear end 36b of the first rail 30 and the front end 78a of the third rail 34 is defined as the first length L1.

Referring to FIG. 10, when the third rail 34 is at the third position P3, the first working member 88 is at a first working position X1, where the first working member 88 is pressed against a lateral side S1 (hereinafter referred to as the first lateral side S1) of the blocking portion 76 of the blocking base 56. And in the course in which the third rail 34 approaches the third position P3, the second working member 90 generates an elastic force while being displaced along the blocking portion 76 of the blocking base 56, releases the elastic force upon moving past the blocking portion 76 of the blocking base 56, and ends up at a first working position Y1, where the second working member 90 is pressed against the opposite lateral side S2 (hereinafter referred to as the second lateral side S2) of the blocking portion 76 of the blocking base 56. The third rail 34 in this state cannot be extended or retracted with respect to the second rail 32.

Referring to FIG. 11 and FIG. 12, an operator may now displace the second operating member 100 by applying a force F1 thereto, in order to rotate the second working member 90 from the first working position Y1 to a second working position Y2, where the second working member 90 is not pressed against the second lateral side S2 of the blocking portion 76, thus allowing the third rail 34 to be retracted with respect to the second rail 32 in a second direction D2.

Figure 13:
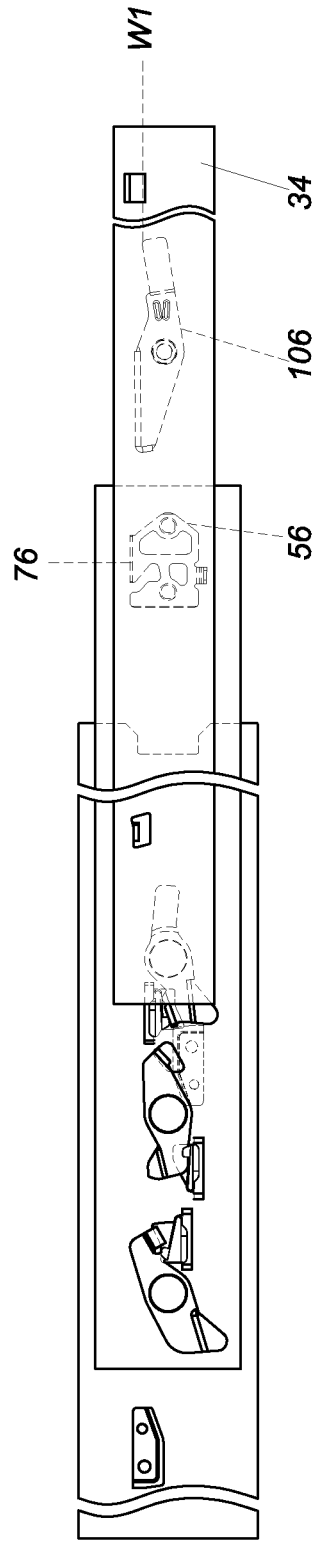
FIG. 13 shows the third rail in FIG. 11 at another extended position with respect to the second rail, with the switching member at a first switching position.
Figure 14:
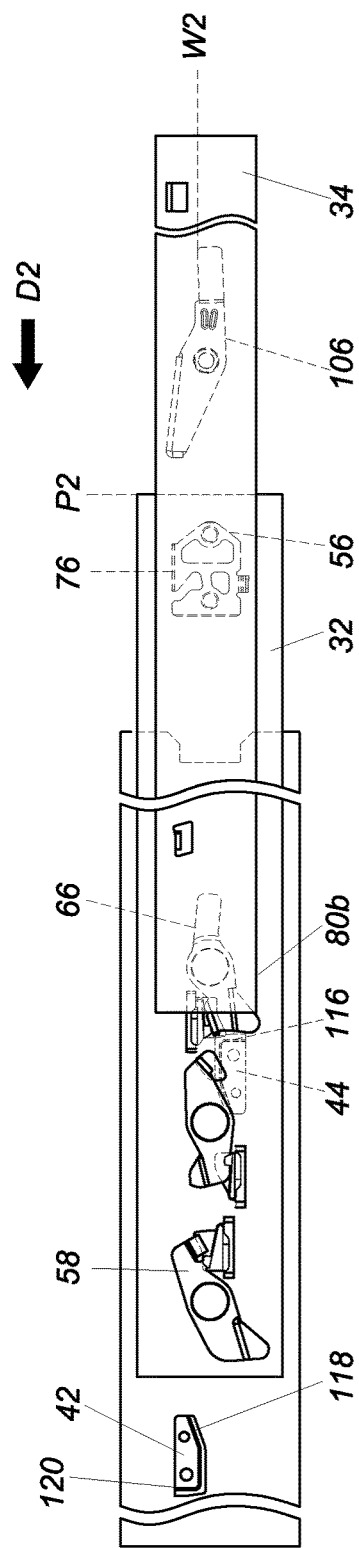
FIG. 14 is similar to FIG. 13, except that the switching member is at a second switching position.

Referring to FIG. 13 and FIG. 14, the operator may also operate the switching member 106 so as to switch it from a first switching position W1 to a second switching position W2. The switching member 106 is offset from the blocking portion 76 of the blocking base 56 when at the first switching position W1 and is not offset from the blocking portion 76 of the blocking base 56 when at the second switching position W2.

In FIG. 14, the third rail 34 has reached a certain position after being displaced with respect to the second rail 32 from the extended position in the second direction D2. At this position, the third rail 34 (e.g., the lower wall 80b of the third rail 34) is pressed against the third engaging member 66 such that the third engaging member 66 is rotated by an angle and thus disengaged from the position-limiting portion 116 of the second blocking member 44.

As shown in FIG. 14 and FIG. 15, the first blocking member 42 has a guiding portion 118 and an engaging portion 120 extending from and bent with respect to the guiding portion 118, wherein the guiding portion 118 may be an inclined or curved surface. When the third rail 34 is further displaced in the second direction D2, the second rail 32 is displaced by the third rail 34 (or more particularly by the switching member 106 at the second switching position W2, i.e., pressed against the second lateral side S2 of the blocking portion 76 of the blocking base 56, as can be seen more clearly in FIG. 16) from the second position P2 in the second direction D2. During displacement in the second direction D2, the first engaging member 58 is rotated by an angle under the guidance of the guiding portion 118 and is pressed against the engaging portion 120 of the first blocking member 42 in response to the elastic force of the first elastic member 60, thereby keeping the second rail 32 at a fourth position P4, e.g., a retracted position. The second rail 32 in this state cannot be displaced with respect to the first rail 30 in the second direction D2 or the first direction D1 (which is the opposite direction of the second direction D2).

It is worth mentioning that, with the switching member 106, rather than the front stopper 86 of the third rail 34, being adjacent to the second lateral side S2 of the blocking portion 76 of the blocking base 56, the rear stopper 84 of the third rail 34 will stay spaced from the second engaging member 62 when the third rail 34 is retracted with respect to the second rail 32; that is to say, the third rail 34 in this state cannot drive the second rail 32 when displaced.

Figure 17:
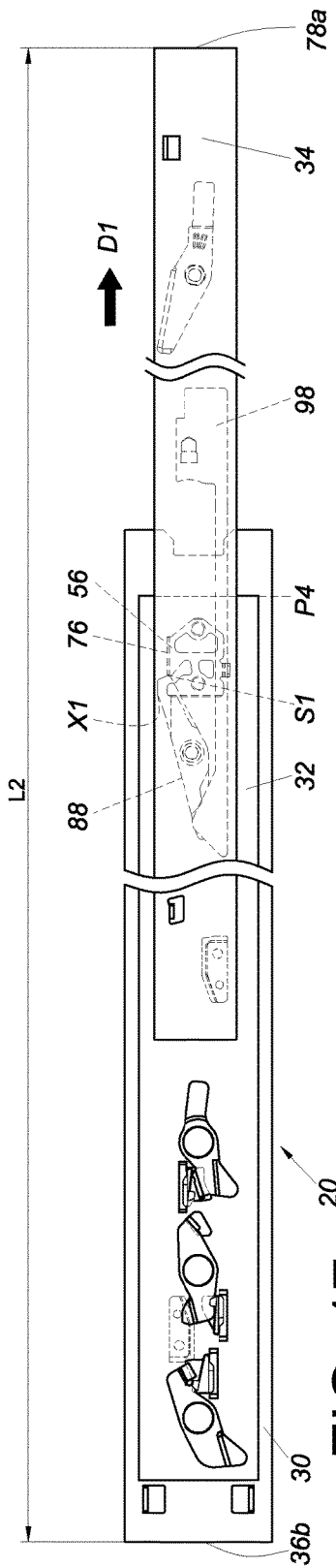
FIG. 17 shows that, with the second rail at the retracted position with respect to the first rail, the third rail of the slide rail assembly according to an embodiment of the present invention is displaced with respect to the second rail in the first direction until the first working member is pressed against the blocking portion of the blocking base of the second rail.

Referring to FIG. 17, when the second rail 32 is at the fourth position P4, the third rail 34 can be displaced with respect to the second rail 32 in the first direction D1 until the first working member 88 is pressed against the first lateral side S1 of the blocking portion 76 of the blocking base 56, at which time the rear end 36b of the first rail 30 and the front end 78a of the third rail 34 define a second length L2 therebetween. The second length L2 is shorter than the first length L1 (see FIG. 9). In other words, by retracting the second rail 32 with respect to the first rail 30 to the fourth position P4, the first length L1 is reduced to the second length L2.

Figure 18:
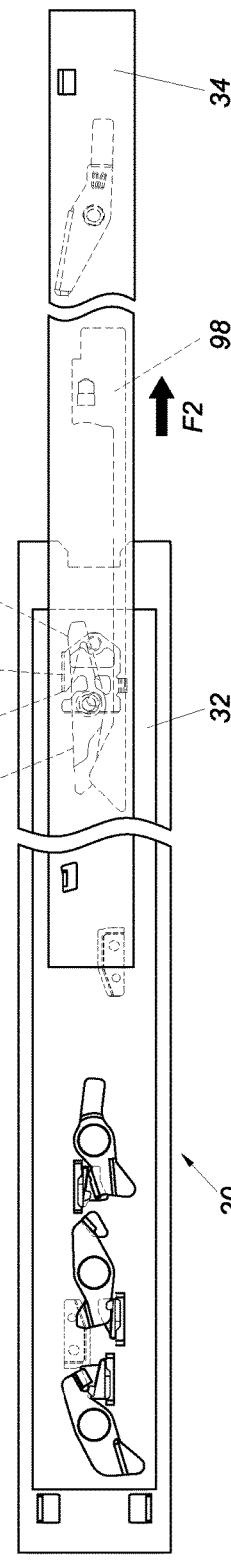
FIG. 18 shows the first working member in FIG. 17 out of engagement with the blocking portion of the blocking base of the second rail.
Figure 19:
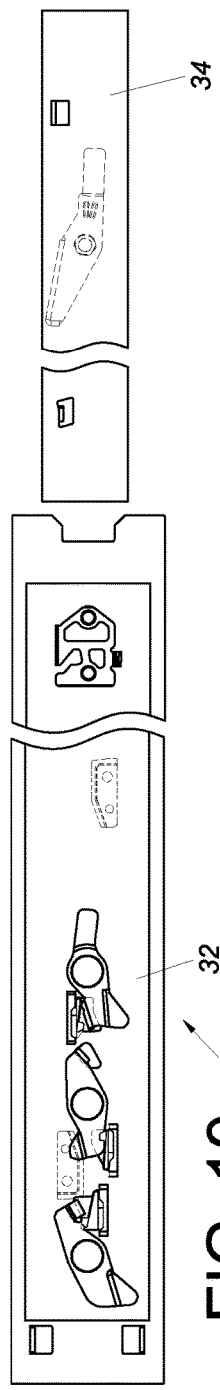
FIG. 19 shows the third rail in FIG. 18 detached from the second rail.

Referring to FIG. 18 and FIG. 19, when the second length L2 prevails, the operator may displace the first operating member 98 by applying a force F2 thereto, in order to displace the first working member 88 from the first working position X1 to a second working position X2, where the first working member 88 is disengaged from the first lateral side S1 of the blocking portion 76 of the blocking base 56 to allow detachment of the third rail 34 from the second rail 32.

In an environment where space is limited, as shown in FIG. 20, there may be a first space d1 between the slide rail assembly 20 in an extended state and an ambient article 122 (e.g., a door or wall). The first space d1, however, can be so narrow that maintenance of the slide rail assembly 20 (e.g., that involving detachment of the third rail 34) is made difficult, if not impossible.

In that case, referring to FIG. 21, an operator may carry out the foregoing operation to retract the second rail 32 with respect to the first rail 30 and keep the second rail 32 engaged with the first rail 30 for the time being, thereby shortening the overall length of the slide rail assembly 20 and creating a second space d2 between the slide rail assembly 20 and the ambient article 122, wherein the second space d2 is wider than the first space d1. By doing so, the operator is provided with more room for operation, which facilitates maintenance of the slide rail assembly 20 or detachment of the third rail 34 from the second rail 32.

Figure 22:
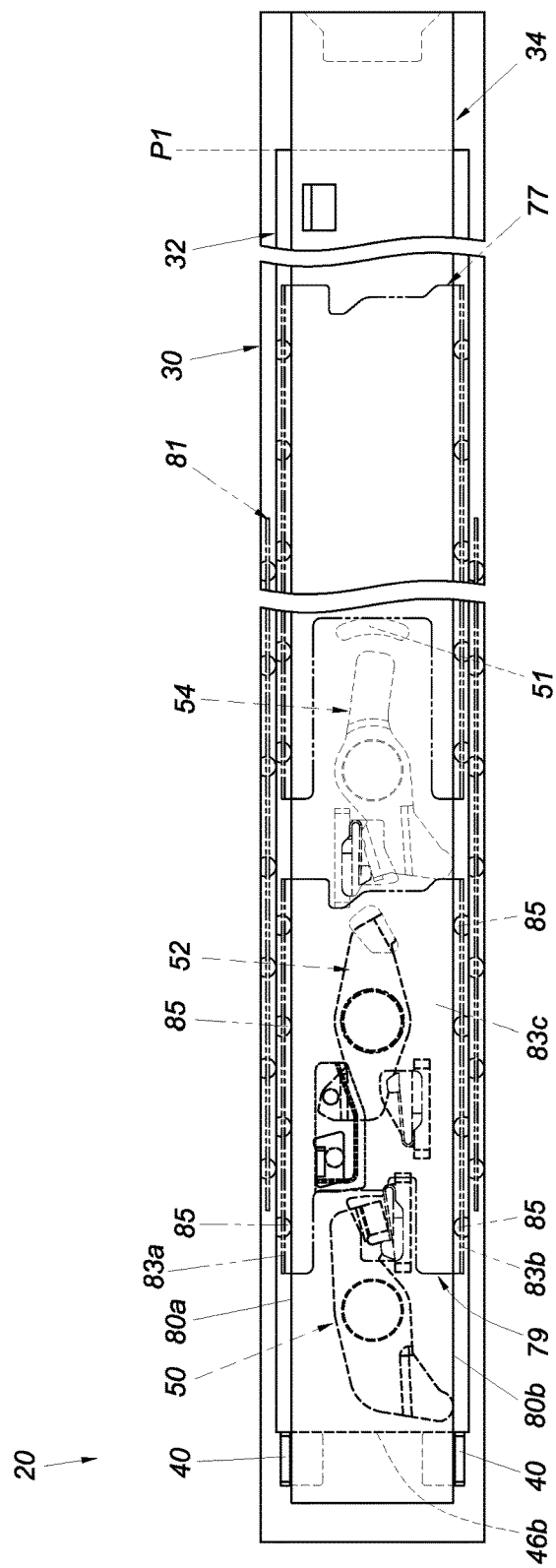
FIG. 22 shows the slide rail assembly according to an embodiment of the present invention in a retracted state.
Figure 23:
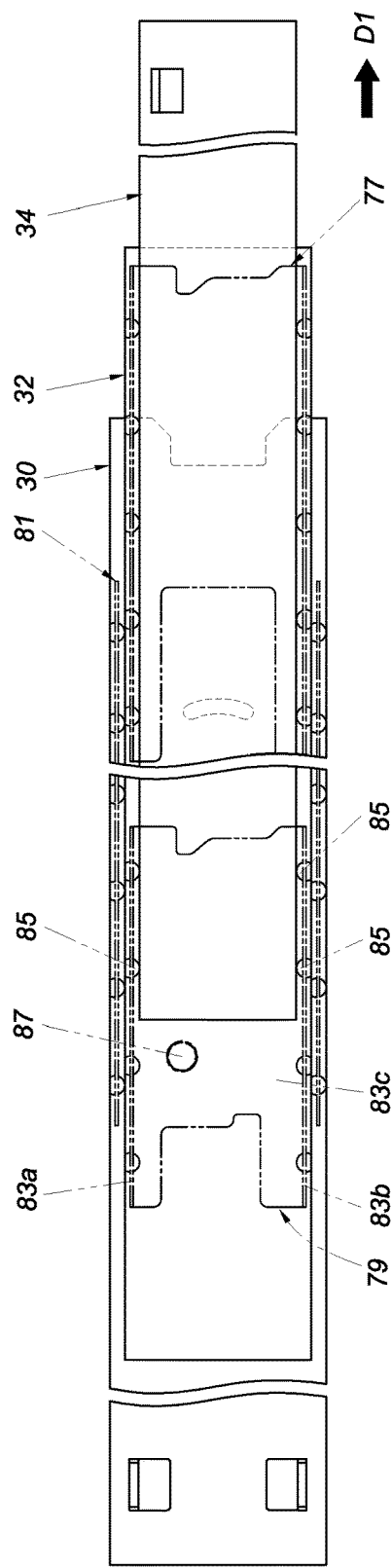
FIG. 23 is similar to FIG. 22, except that the third rail of the slide rail assembly is displaced with respect to the second rail in the first direction.

Referring to FIG. 22, when the slide rail assembly 20 is in the retracted state, the second rail 32 is retracted with respect to the first rail 30 to the first position P1, where the rear end 46b of the second rail 32 is pressed against the at least one contact portion 40 of the first rail 30, and the third rail 34 is also retracted with respect to the second rail 32. Preferably, the supporting structure 79 supports the third rail 34 (e.g., a rail section, such as a rear rail section, of the third rail 34) when the third rail 34 is retracted with respect to the second rail 32. The supporting structure 79 includes an upper portion 83a and a lower portion 83b. Preferably, at least one rolling member (e.g., ball or roller) 85, such as a plurality of rolling members 85, is arranged on each of the upper portion 83a and the lower portion 83b in order to support the corresponding upper wall 80a or lower wall 80b of the third rail 34. The first engaging mechanism 50, the second engaging mechanism 52, and the third engaging mechanism 54 are located between the separating member 51 of the second rail 32 and the rear end 46b of the second rail 32. Preferably, the supporting structure 79 is fixedly mounted on the second rail 32 to provide stable support for the rear rail section of the third rail 34. More specifically, the supporting structure 79 further includes a middle portion 83c extending between and connecting the upper portion 83a and the lower portion 83b, and the supporting structure 79 is fixedly mounted on the second rail 32 via a fixing member 87 (e.g., a rivet as shown in FIG. 23) passing through the middle portion 83c. Please note that the rivet is only a preferred embodiment of the fixing member 87; the present invention has no limitation on how the supporting structure 79 is mounted on the second rail 32.

Furthermore, the first slide-facilitating device 77 provides support for a front rail section of the third rail 34. When the third rail 34 is retracted with respect to the second rail 32, the first slide-facilitating device 77 is pressed against the separating member 51 of the second rail 32 and therefore kept from displacing toward the rear end 46b of the second rail 32. The second slide-facilitating device 81, on the other hand, provides support for the second rail 32. In this embodiment, each of the first slide-facilitating device 77 and the second slide-facilitating device 81 includes a plurality of balls (or rollers) by way of example.

Referring to FIG. 23, when the third rail 34 is displaced with respect to the second rail 32 in the first direction D1, the third rail 34 is gradually displaced with respect to the supporting structure 79, and the rolling members 85 of the upper portion 83a and of the lower portion 83b of the supporting structure 79 make it easier to displace the third rail 34 with respect to the second rail 32. The balls (or rollers) of the first slide-facilitating device 77 also make it easier to displace the third rail 34 with respect to the second rail 32. When the second rail 32 is displaced with respect to the first rail 30 in the first direction D1, the balls (or rollers) of the second slide-facilitating device 81 facilitate displacement of the second rail 32 with respect to the first rail 30.

Figure 24:
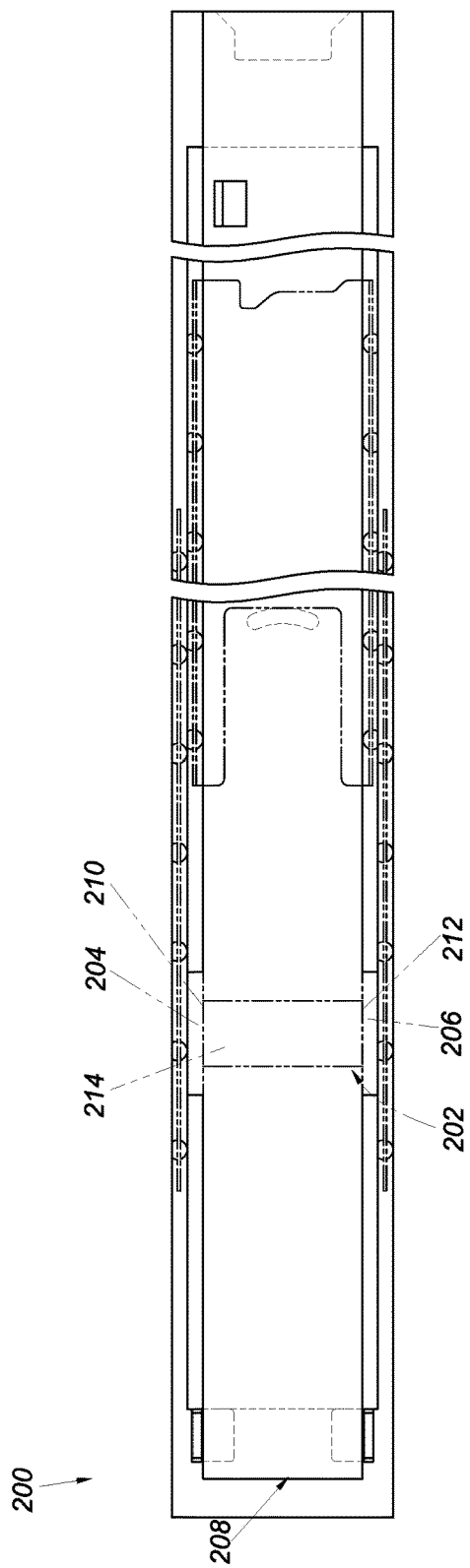
FIG. 24 shows a slide rail assembly according to another embodiment of the present invention.

FIG. 24 shows a slide rail assembly 200 according to a second embodiment of the present invention. The second embodiment is different from the first embodiment (see FIG. 22 for example) substantially in that the supporting structure 202 includes an upper portion 204 and a lower portion 206 for supporting the upper wall 210 and the lower wall 212 of the third rail 208 respectively and can therefore support a rail section (e.g., a rear rail section) of the third rail 208 (please note that the first engaging mechanism 50, the second engaging mechanism 52, and the third engaging mechanism 54 are not shown in FIG. 24). The third rail 208 in the second embodiment may also include a middle portion 214 extending between and connecting the upper portion 204 and the lower portion 206.

While the present invention has been disclosed herein by way of the foregoing preferred embodiments, it should be understood that the embodiments described above are not intended to be restrictive of the scope of the invention. The scope of patent protection sought by the applicant is defined by the appended claims.

The invention claimed is:

1. A slide rail assembly, comprising:
   a first rail including a front end and a rear end;
   a second rail displaceable with respect to the first rail, wherein the second rail includes a front end, a rear end, and a separating member located between the front end of the second rail and the rear end of the second rail;
   a third rail displaceable with respect to the second rail, wherein the third rail includes a front end and a rear end;

a slide-facilitating device movably mounted between the separating member of the second rail and the front end of the second rail, wherein the slide-facilitating device provides support for the third rail;

a supporting structure located between the separating member of the second rail and the rear end of the second rail, wherein the supporting structure is configured for supporting the third rail when the third rail is retracted with respect to the second rail;

a first engaging mechanism movably mounted on the second rail, wherein when the second rail is displaced with respect to the first rail from a first position to a second position in a first direction and the third rail is displaced with respect to the second rail to a third position in the first direction and thus moved beyond the second rail, the rear end of the first rail and the front end of the third rail define a first length therebetween; and when the second rail is displaced from the second position to a fourth position in a second direction, the first length between the rear end of the first rail and the front end of the third rail is reduced to a second length, and the second rail is at the fourth positon with respect to the first rail thanks to the first engaging mechanism; and a first working member and a blocking base, wherein the first working member is mounted on the third rail and is displaceable between a first working position and a second working position; the blocking base is arranged on the second rail and includes a blocking portion; when the third rail is displaced to a predetermined position in the first direction, the first working member is at the first working position and pressed against a lateral side of the blocking portion of the blocking base; and when displaced from the first working positon to the second working position, the first working member is no longer pressed against the blocking portion of the blocking base, thus allowing the third rail to be detached from the second rail.

2. The slide rail assembly of claim 1, wherein the third rail includes an upper wall, a lower wall, and a longitudinal wall connected between the upper wall and the lower wall; the supporting structure includes an upper portion and a lower portion; and at least one rolling member is arranged on each of the upper portion and the lower portion and is configured for supporting a corresponding one of the upper wall and the lower wall of the third rail.

3. The slide rail assembly of claim 1, wherein the third rail includes an upper wall, a lower wall, and a longitudinal wall connected between the upper wall and the lower wall; and the supporting structure includes an upper portion and a lower portion for supporting the upper wall and the lower wall of the third rail respectively.

4. The slide rail assembly of claim 1, further comprising a second working member elastically mounted on the third rail, wherein while the third rail is being displaced to the predetermined positon in the first direction, the second working member is displaced along the blocking portion of the blocking base, and once moved past the blocking portion of the blocking base, the second working member is pressed against another lateral side of the blocking portion of the blocking base.

5. The slide rail assembly of claim 1, further comprising a switching member mounted on the third rail, wherein the switching member is displaceable between a first switching position and a second switching position, and the switching member is offset from the blocking portion of the blocking base when at the first switching position and is not offset from the blocking portion of the blocking base when at the second switching position.

6. The slide rail assembly of claim 5, wherein the third rail includes a front stopper spaced from the switching member.

7. A slide rail assembly comprising:
a first rail including a front end and a rear end;
a second rail displaceable with respect to the first rail, wherein the second rail includes a front end, a rear end, and a separating member located between the front end of the second rail and the rear end of the second rail;
a third rail displaceable with respect to the second rail, wherein the third rail includes a front end and a rear end;
a slide-facilitating device movably mounted between the separating member of the second rail and the front end of the second rail, wherein the slide-facilitating device provides support for the third rail;
a supporting structure located between the separating member of the second rail and the rear end of the second rail, wherein the supporting structure is configured for supporting the third rail when the third rail is retracted with respect to the second rail;
a first engaging mechanism movably mounted on the second rail, wherein when the second rail is displaced with respect to the first rail from a first position to a second position in a first direction and the third rail is displaced with respect to the second rail to a third position in the first direction and thus moved beyond the second rail, the rear end of the first rail and the front end of the third rail define a first length therebetween; and when the second rail is displaced from the second position to a fourth position in a second direction, the first length between the rear end of the first rail and the front end of the third rail is reduced to a second length, and the second rail is at the fourth positon with respect to the first rail thanks to the first engaging mechanism; and
a first blocking member arranged on the first rail, wherein the second rail is pressed against the first blocking member via the first engaging mechanism when at the fourth position.

8. The slide rail assembly of claim 7, wherein the first engaging mechanism includes a first engaging member and a first elastic member for applying an elastic force to the first engaging member, and the first engaging member is pressed against the first blocking member by the elastic force of the first elastic member when the second rail is at the fourth position.

9. A slide rail assembly, comprising:
a first rail including a front end and a rear end,
a second rail displaceable with respect to the first rail, wherein the second rail includes a front end, a rear end, and a separating member located between the front end of the second rail and the rear end of the second rail;
a third rail displaceable with respect to the second rail, wherein the third rail includes a front end and a rear end;
a slide-facilitating device movably mounted between the separating member of the second rail and the front end of the second rail, wherein the slide-facilitating device provides support for the third rail;
a supporting structure located between the separating member of the second rail and the rear end of the second rail, wherein the supporting structure is configured for supporting the third rail when the third rail is retracted with respect to the second rail;

a first engaging mechanism movably mounted on the second rail, wherein when the second rail is displaced with respect to the first rail from a first position to a second position in a first direction and the third rail is displaced with respect to the second rail to a third position in the first direction and thus moved beyond the second rail, the rear end of the first rail and the front end of the third rail define a first length therebetween; and when the second rail is displaced from the second position to a fourth position in a second direction, the first length between the rear end of the first rail and the front end of the third rail is reduced to a second length, and the second rail is at the fourth positon with respect to the first rail thanks to the first engaging mechanism; and a second blocking member and a second engaging mechanism, wherein the second blocking member is arranged on the first rail and includes a disengaging portion, the second engaging mechanism is movably mounted on the second rail, the third rail includes a rear stopper, the third rail is able to be pressed against the second engaging mechanism via the rear stopper and thus simultaneously drive the second rail into displacement from the first position in the first direction, and when the second rail is displaced to a predetermined position, the second engaging mechanism is disengaged from the rear stopper by the disengaging portion of the second blocking member.

10. The slide rail assembly of claim 9, wherein the second engaging mechanism includes a second engaging member and a second elastic member for applying an elastic force to the second engaging member, and the third rail is able to be pressed against the second engaging member via the rear stopper.

11. The slide rail assembly of claim 9, further comprising a third engaging mechanism movably mounted on the second rail, wherein the second blocking member includes a position-limiting portion; when the second rail is displaced to the second position, the third engaging mechanism is adjacent to the position-limiting portion of the second blocking member; and the first engaging mechanism, the second engaging mechanism, and the third engaging mechanism are located between the separating member of the second rail and the rear end of the second rail.

12. The slide rail assembly of claim 11, wherein the third engaging mechanism includes a third engaging member and a third elastic member for applying an elastic force to the third engaging member, and when the second rail is displaced to the second position, the third engaging member is adjacent to the position-limiting portion of the second blocking member responsive to the elastic force of the third elastic member.

13. A slide rail assembly adapted for mounting an object to a rack, the slide rail assembly comprising:

a first rail mountable to the rack, wherein the first rail includes a front end and a rear end;

a second rail displaceable with respect to the first rail, wherein the second rail includes a front end, a rear end, and a separating member located between the front end of the second rail and the rear end of the second rail;

a third rail displaceable with respect to the second rail, wherein the third rail is configured for supporting the object and includes a front end and a rear end;

a slide-facilitating device movably mounted between the separating member of the second rail and the front end of the second rail, wherein the slide-facilitating device provides support for the third rail to facilitate displacement of the third rail with respect to the second rail;

a supporting structure located between the separating member of the second rail and the rear end of the second rail, wherein the supporting structure is configured for supporting the third rail when the third rail is retracted with respect to the second rail;

a first blocking member arranged on the first rail;

a first engaging mechanism movably mounted on the second rail;

a first working member mounted on the third rail, wherein the first working member is displaceable between a first working position and a second working position; and a first working member and a blocking base, wherein the first working member is mounted on the third rail and is displaceable between a first working position and a second working position; the blocking base is arranged on the second rail and includes a blocking portion; when the third rail is displaced to a predetermined position in the first direction, the first working member is at the first working position and pressed against a lateral side of the blocking portion of the blocking base; and when displaced from the first working positon to the second working position, the first working member is no longer pressed against the blocking portion of the blocking base, thus allowing the third rail to be detached from the second rail;

wherein when the second rail is displaced with respect to the first rail from a first position to a second position in a first direction and the third rail is displaced with respect to the second rail to a third position in the first direction and thus moved beyond the second rail, the rear end of the first rail and the front end of the third rail define a first length therebetween;

wherein when the second rail is displaced from the second position to a fourth position in a second direction, the first length between the rear end of the first rail and the front end of the third rail is reduced to a second length, and the second rail is at the fourth positon with respect to the first rail thanks to the first engaging mechanism pressed against the first blocking member;

wherein when the first working member is displaced from the first working position to the second working position, the third rail is detachable from the second rail.

* * * * *